US010574268B2

(12) United States Patent
Hastings

(10) Patent No.: US 10,574,268 B2
(45) Date of Patent: Feb. 25, 2020

(54) SMALL MAJORANA FERMION CODES

(71) Applicant: Microsoft Technology Licensing, LLC, Redmond, WA (US)

(72) Inventor: Matthew Hastings, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 117 days.

(21) Appl. No.: 15/623,286

(22) Filed: Jun. 14, 2017

(65) Prior Publication Data

US 2018/0248566 A1    Aug. 30, 2018

Related U.S. Application Data

(60) Provisional application No. 62/464,774, filed on Feb. 28, 2017.

(51) Int. Cl.
*H03M 13/19* (2006.01)
*G06N 10/00* (2019.01)

(52) U.S. Cl.
CPC ............ *H03M 13/19* (2013.01); *G06N 10/00* (2019.01)

(58) Field of Classification Search
CPC ................................ G06N 10/00; H03M 13/19
See application file for complete search history.

(56) References Cited

U.S. PATENT DOCUMENTS

| 10,352,992 B1* | 7/2019 | Zeng | G01R 31/2851 |
| 2014/0354326 A1* | 12/2014 | Bonderson | G06N 10/00 326/5 |
| 2015/0006597 A1 | 1/2015 | Troyer et al. | |
| 2015/0200778 A1* | 7/2015 | Shi | H04L 9/0866 380/46 |

OTHER PUBLICATIONS

Sergey Bravyi et al."Majorana fermion codes;" Aug. 17, 2010.*
Bravyi et al., "Majorana fermion codes," *New Journal of Physics*, vol. 12, pp. 1-21 (Aug. 2010).
Gottesman, "Stabilizer Codes and Quantum Error Correction," Ph.D. Thesis, California Institute of Technology, 122 pp. (May 1997).
Hastings, "Small Majorana Fermion Codes," ArXiv:1703.00612v1, pp. 1-11 (Mar. 2017).
Hyart et al., "Flux-controlled quantum computation with Majorana fermions," *Phys. Rev. B*, vol. 88, pp. 1-20 (Jul. 2013).
International Search Report and Written Opinion dated Apr. 20, 2018, from International Patent Application No. PCT/US2018/017733, 16 pp.

(Continued)

*Primary Examiner* — Guy J Lamarre
(74) *Attorney, Agent, or Firm* — Klarquist Sparkman, LLP

(57) ABSTRACT

The disclosed technology concerns tools and techniques for implementing error-correction codes in a quantum computing device. In particular embodiments, Majorana fermion stabilizer codes having small numbers of modes and distance are disclosed. Particular embodiments have an upper bound on the number of logical qubits for distance 4 codes, and Majorana fermion codes are constructed that saturate this bound. Other distance 4 and 6 codes are also disclosed.

19 Claims, 5 Drawing Sheets

(56) References Cited

OTHER PUBLICATIONS

Karzig et al., "Scalable Designs for Quasiparticle-Poisoning-Protected Topological Quantum Computation with Majorana Zero Modes," *Phys. Rev. B.*, vol. 95, pp. 1-34 (Jun. 2017).
Kitaev, "Anyons in an exactly solved model and beyond," *Annals of Physics*, vol. 321, pp. 2-111 (2006).
Landau et al., "Towards Realistic Implementations of a Majorana Surface Code," *Physical Review Letters*, vol. 116, pp. 1-6 (Feb. 2016).
Leemhuis, "Geometrical Quantum Codes," Thesis, pp. 114 (Aug. 2010).
Plugge et al., "Majorana box qubits," *New Journal of Physics*, vol. 19, pp. 1-11 (2016).
Plugge et al., "Roadmap to Majorana surface codes," *Phys. Rev. B*, vol. 94, pp. 1-23 (Jun. 2016).
Vijay et al., "Braiding without Braiding: Teleportation-Based Quantum Information Processing with Majorana Zero Modes," *Phys. Rev. B*, vol. 94, pp. 1-11 (Sep. 2016).

\* cited by examiner

SMALL MAJORANA FERMION CODES

CROSS REFERENCE TO RELATED APPLICATIONS

This application claims the benefit of U.S. Provisional Application No. 62/464,774 entitled "SMALL MAJORANA FERMION CODES" and filed on Feb. 28, 2017, which is hereby incorporated herein by reference in its entirety.

FIELD

The disclosed technology concerns quantum computing devices and error-correction mechanisms for such devices.

SUMMARY

The disclosed technology concerns tools and techniques for implementing error-correction codes in a quantum computing device. In particular embodiments, Majorana fermion stabilizer codes having small numbers of modes and distance are disclosed. Particular embodiments have an upper bound on the number of logical qubits for distance 4 codes, and Majorana fermion codes are constructed that saturate this bound. Other distance 4 and 6 codes are also disclosed. These codes are understood to have the largest possible number of logical qubits for the given number of physical Majorana modes. Some of these codes have more logical qubits than any Majorana fermion code derived from a qubit stabilizer code.

In some embodiments, a topological quantum computer is configured to implement a quantum computation using Majorana zero modes. In certain implementations, a set of $N_{maj}$ Majorana zero modes are configured to obtain a code space with K logical bits, where K is less than $N_{maj}$, and wherein the code space is formed from a series of stabilizers formed among the Majorana zero modes and configured to provide error correction to the Majorana zero modes during the quantum computation.

In further embodiments, a quantum computing device is configured to implement logical qubits via Majorana zero modes in a topological quantum infrastructure, the Majorana zero modes being arranged to realize a set of physical qubits whose states are correctable to produce the logic qubits via a series of stabilizers formed among the physical qubits.

In some example embodiments, Hamming Majorana codes for quantum computing devices are generated. In one example implementation, a number of available Majorana zero modes is input, a desired number of stabilizers is input, and one or more Hamming Majorana codes are generated for implementing stabilizers with the available Majorana zero modes and in accordance with the desired number of stabilizers. In example implementations, the generation of the Hamming Majorana codes is performed at least in part using a random search procedure. In certain implementations, the generation of the Hamming Majorana codes is performed at least in part with a constrained distance (e.g., 4, 6, or any other suitable distance).

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

DETAILED DESCRIPTION

I. General Considerations

Figure 1A:
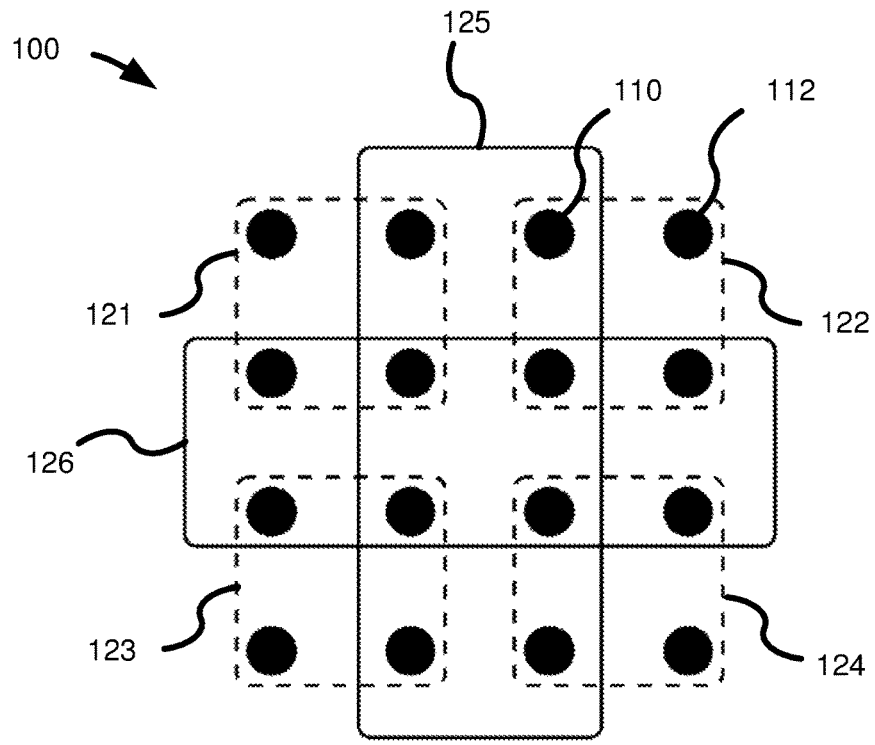
FIG. 1(A) is a block diagram showing stabilizers for a 16 Majorana code derived from the 4 qubit code.

As used in this application, the singular forms a, an, and the include the plural forms unless the context clearly dictates otherwise. Additionally, the term includes means comprises. Further, the term coupled does not exclude the presence of intermediate elements between the coupled items. Further, as used herein, the term and/or means any one item or combination of any items in the phrase.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like produce and provide to describe the disclosed methods. These terms are high-level abstractions of the actual operations that are performed. The actual operations that correspond to these terms will vary depending on the particular implementation and are readily discernible by one of ordinary skill in the art.

II. Introduction to the Disclosed Technology

Qubit stabilizer codes are a fundamental way to construct families of quantum error correcting codes. These codes use some number, $N_{qub}$, of physical qubits, to construct some smaller number, K, of logical qubits. The code space is the +1 eigenspace of several mutually commuting operators. These operators are called stabilizers, and are taken to be products of Pauli operators. D. Gottesman, arXiv preprint quant-ph/9705052 (1997). Majorana fermion codes are a natural variant of stabilizer codes where the stabilizers are instead taken to be products of Majorana operators. See S. Bravyi, B. M. Terhal, and B. Leemhuis, New Journal of Physics 12, 083039 (2010). Instead of using qubits as the physical degrees of freedom, the Majorana codes use some number, $N_{maj}$, of Majorana modes, to obtain a code space with K logical qubits (see below for identification of the code space with qubits).

Qubit stabilizer codes can be converted into Majorana fermion codes, with the properties of the Majorana fermion codes (including distance, number of logical qubits, and weight of generators) depending on those of the original stabilizer code. See S. Bravyi, B. M. Terhal, and B. Leemhuis, New Journal of Physics 12, 083039 (2010); A. Kitaev, Annals of Physics 321, 2 (2006). Further, other Majorana fermion codes exist that can not be obtained by such a conversion procedure. See A. Kitaev, Annals of Physics 321, 2 (2006).

In this disclosure, Majorana fermion codes are disclosed that cannot be obtained from a qubit stabilizer code. Further, the focus is on small codes. That is, rather than studying asymptotic properties with large numbers of physical Majorana modes, this disclosure instead considers codes that have small $N_{maj}$ and obtain a desirable (or optimal) distance d for the given K.

One motivation for studying small Majorana fermion codes is that realizations of Majoranas in physical devices will likely have very low error rates. See T. Karzig, C. Knapp, R. Lutchyn, P. Bonderson, M. Hastings, C. Nayak, J. Alicea, K. Flensberg, S. Plugge, Y. Oreg, et al., arXiv preprint arXiv:1610.05289 (2016). Although these modes may have low enough error rates that no code will be necessary, some relatively low error rate can be expected. For such a low error rate, specialized low-distance codes as described herein are highly desirable.

In some cases, the small Majorana fermion codes disclosed herein have a highly desirable tradeoff between $N_{maj}$, d, K. These codes are closely related to Hamming codes. In other cases, computer-assisted investigation techniques were used to identify codes that have a desirable tradeoff.

III. Majorana Stabilizer Codes

A. Hilbert Space, Code Space, and Stabilizer Group

Consider a system with $N_{maj}$ Majorana fermion operators. These Majorana fermion operators can be denoted by $\gamma_a$ with $a \in 1, \ldots, N_{maj}$. They obey the anti-commutation relations $$\{\gamma_a, \gamma_b\} = 2\delta_{a,b}. \tag{III.1}$$

It will be assumed that $N_{maj}$ is even. The minimal Hilbert space compatible with these anti-commutation relations has dimension $2^{N_{maj}/2}$ and this will be taken to be the dimension of the Hilbert space of the system. A Majorana fermion code is a subspace of this Hilbert space.

This disclosure also considers Majorana fermion codes that have a stabilizer form, so that there are several operators, called "stabilizers", such that the code space (the subspace of the Hilbert space which describes valid codewords) is the space in which each of these operators assumes some given eigenvalue. Each of these operators will be a product of an even number of Majorana fermion operators; physically, this is chosen so that they correspond to bosonic operators. If the number of operators in the product is equal to 2 mod 4, then the operator is anti-Hermitian and the possible eigenvalue are either +i or −i while if the number of operators in the product is equal to 0 mod 4 then the operator is Hermitian and the possible eigenvalues are either +1 or −1. Further, in particular embodiments, all of these operators can be selected to commute with each other. Thus, as an example code, one might take a system with $N_{maj}=6$ and with stabilizers $\gamma_1\gamma_2\gamma_3\gamma_4\gamma_5\gamma_6$ and $\gamma_1\gamma_2$.

The stabilizers generate a group, the stabilizer group, which is the group generated by products of stabilizers. Taking the quotient of this group by all elements of the group which are proportional to the identity (e.g., all elements equal to 1, −1) gives a group with $2^{N_{stab}}$ elements, where $N_{stab}$ is the minimal number of stabilizers that generate this group. That is, if for example one were given a list of stabilizers $\gamma_1\gamma_2\gamma_3\gamma_4\gamma_5\gamma_6$ and $\gamma_1\gamma_2$ and $\gamma_3\gamma_4\gamma_5\gamma_6$ then the group has $N_{stab}=2$ (despite the fact that there were 3 stabilizers in the list) as it is generated by 2 stabilizers (indeed, any two stabilizers from that list suffices).

One way to understand this group is to identify each element of the stabilizer group with a bit string of length $N_{maj}$. There will be a 1 in the a-th entry of the bit string if the operator $\gamma_a$ is in the given element of the stabilizer group. Thus, with $N_{maj}=6$, the operator $\gamma_1\gamma_2$ will correspond to the string 110000. The sign of the operator is irrelevant to the bit string, so that $\gamma_1\gamma_2$ and $-\gamma_1\gamma_2=\gamma_2\gamma_1$ correspond to the same bit string. This bit string can equally be regarded as a vector in $\mathbb{F}_2^{N_{maj}}$. Given two operators $O_1, O_2$ with corresponding bit strings $b_1, b_2$, the product $O_1 O_2$ will correspond to the bit string $b_1+b_2$ where addition is in $\mathbb{F}_2^{N_{maj}}$. Thus, the stabilizer group is some subspace of $\mathbb{F}_2^{N_{maj}}$, with dimension $N_{stab}$.

So, Majorana fermion codes will correspond to subspaces of $\mathbb{F}_2^{N_{maj}}$ with the requirement that the inner product of any two vectors in the subspace is equal to 0; in the language of classical coding theory, these subspaces are self-orthogonal codes (note that in the case of Majoranas this subspace describes stabilizers while in the case of classical coding theory it is interpreted as a space of codewords). To see this, note that the inner product of any vector in the subspace with itself must be zero (because stabilizers are products of an even number of Majorana operators). The inner product of any two different vectors in the subspace must also be zero as follows: recall that any pair of operators $O_1, O_2$ in the stabilizer group must commute with each other. One can commute each operator $\gamma_a$ in $O_2$ through $O_1$ and keep track of the total sign; if $\gamma_a$ is also in $O_1$, then $\gamma_a$ anti-commutes with $O_1$ and otherwise it commutes (this follows because $O_1$ has an even number of Majorana operators and so if $\gamma_a$ is in $O_1$ then there are an odd number of operators in $O_1$ which anti-commute with $\gamma_a$); so, if $O_1, O_2$ commute then there are an even number of bits for the corresponding bit strings both contain a 1.

The dimension of the code space is equal to $$2^{N_{maj}/2 - N_{stab}}.$$

And:

$$K = N_{maj}/2 - N_{stab}, \tag{III.2}$$

and K is termed the number of "logical qubits".

A logical operator is a product of Majorana operators which commutes with all operators in the stabilizer group but which is not itself in the stabilizer group. As shown in S. Bravyi et al., New Journal of Physics 12, 083039 (2010), one can find 2K logical operators $X_1, \ldots, X_K, Z_1, \ldots, Z_K$ which obey the usual Pauli commutation relations. This motivates saying that there are K logical qubits.

B. Distance

The "weight" of an operator is the Hamming weight of the corresponding bit string. The distance of a code is defined to be the minimum of the weight of all nontrivial logical operators (here, nontrivial means not corresponding to the identity operator).

The discussion below will concern the case where the so-called "fermion parity" operator $\gamma_1 \gamma_2 \ldots \gamma_{N_{maj}}$ is in the stabilizer group. Thus, when reference is made to optimality properties of codes, this case will be the one considered. As a result, all logical operators have even weight (otherwise, they would not commute with fermion parity) and so the distance of the code is even and at least 2. There are two motivations for requiring that the fermion parity operator is in the stabilizer group. First, physical implementations may naturally produce a code where it is in the stabilizer group due to charging energy effects. See L. A. Landau et al., Physical Review Letters 116, 050501 (2016), 1509.05345; S. Plugge et al, "Roadmap to Majorana surface codes," arXiv:1606.08408; S. Vijay et al., "Braiding without Braiding: Teleportation-Based Quantum Information Processing with Majorana Zero Modes" (2016), arXiv:1609.00950; S. Plugge et al., "Majorana box qubits," arXiv:1609.01697; and T. Hyart et al., Physical Review B 88, 035121 (2013). Second, one cannot create superpositions of states without different fermion parity. Conversely, in S. Bravyi et al., New Journal of Physics 12, 083039 (2010), it was suggested that codes with an odd weight logical operator might have better error correction properties by combining topological and parity protection.

Let $K_{max}(N_{maj},d)$ denote the maximal possible number of logical qubits (over all possible codes) for a code with $N_{maj}$ physical Majorana modes and distance d. A code with distance d can detect any error acting on fewer than d Majorana modes and can correct, any error acting on fewer than d/2 Majorana modes. Codes with distance d=2 are not particularly useful: they cannot correct an error on a single Majorana mode; the simplest example of such a d=2 code is simply to take the stabilizer group to be generated by the fermion parity operator so that all even weight operators commute with the stabilizer group and no odd weight operators do. In this disclosure, example codes having a small distance (e.g., d=4 and d=6) are disclosed and investigated.

The number $K_{max}$ is non-decreasing in $N_{maj}$:

$$K_{max}(N_{maj}+2,d) \geq K_{max}(N_{maj},d). \tag{III.3}$$

To see this, consider a code C with $N_{maj}$ physical Majoranas and K logical qubits. Define a new code C' for $N_{maj}+2$ physical Majoranas by taking the stabilizer group of C' to be generated by the stabilizers of C (acting on the first $N_{maj}$ operators out of the $N_{maj}+2$ physical Majoranas of C') and also by the operator $\gamma_{N_{maj}+1}\gamma_{N_{maj}+2}$. Then, any product of Majorana operators which commutes with the stabilizer group of C' must be of the form O or $O\gamma_{n_{phys}+1}\gamma_{n_{phys}+2}$ where O is either a logical operator of C or O is in the stabilizer group of C. If O is not a logical operator for C (O is in the stabilizer group of C), then O and $O\gamma_{n_{phys}+1}\gamma_{n_{phys}+2}$ are both in the stabilizer group of C'. If O is a logical operator, then it must have weight at least equal to the distance of C and so C' has the same distance as C.

Conversely, given a code C' on $N_{maj}$ Majoranas which has an element of the stabilizer group with weight 2, then such an element is equal to (after possibly relabelling the Majorana operators) $\gamma_{N_{maj}-1}\gamma_{N_{maj}}$ and C' can be formed from a code C with $N_{maj}-2$ Majorana operators using the construction of the above paragraph.

A Majorana fermion code will be said to be "degenerate" if there exists a nontrivial (not proportional to the identity) element of the stabilizer group with weight smaller than d, and it is said to be non-degenerate otherwise.

C. Majorana Fermion Codes from Qubit Stabilizer Codes

In this section, the construction of Majorana fermion codes given a qubit stabilizer code is reviewed. Given a qubit stabilizer code with $N_{qub}$ qubits, construct a Majorana fermion code with $N_{maj}=4N_{qub}$ as follows. For each qubit i of the qubit stabilizer code, define 4 Majorana fermions labelled by a pair (i,a), where $a \in \{1, \ldots, 4\}$. In accordance with certain embodiments, the stabilizer group of the Majorana fermion code is generated by the following stabilizers. First, for every i, one has the stabilizer $\gamma_{(i,1)}\gamma_{(i,2)}\gamma_{(i,3)}\gamma_{(i,4)}$. The four Majorana fermions i,a have a four dimensional Hilbert space, but the +1 eigenspace of this stabilizer is only two dimensional and so corresponds to a qubit. Then, one can identify the operator $X_i$ in the qubit code with $\gamma_{(i,1)}\gamma_{(i,2)}$ and identify the operator $Z_i$ with $\gamma_{(i,1)}\gamma_{(i,3)}$. Then, for every stabilizer of the qubit code, one can map that stabilizer to a stabilizer of the Majorana fermion code, by replacing each $X_i$ or $Z_i$ with the appropriate $\gamma_{(i,1)}\gamma_{(i,2)}$ or $\gamma_{(i,1)}\gamma_{(i,3)}$, respectively.

As shown in S. Bravyi et al., New Journal of Physics 12, 083039 (2010) and A. Kitaev, Annals of Physics 321, 2 (2006), the distance of the resulting Majorana fermion code is twice the distance of the qubit stabilizer code.

IV. Distance d=4 Codes: Analytical Results

In this section, codes with distance d=4 are considered and analytical results are given. In the next section, results are given of a numerical search for d=4 codes as well as d=6 codes.

A. Upper Bounds

Let $K_{max}^d(N_{maj}, d)$ denote the maximal number of logical qubits for a degenerate code with distance $N_{maj}$ physical qubits and distance d and let $K_{max}^{nd}(N_{maj},d)$ denote the maximal number of logical qubits for a non-degenerate code with $N_{maj}$ physical qubits and distance d. For a degenerate code with d=4, there must be an element of the stabilizer group with weight 2, and so, by the discussion below Eq. III.3, one has $K_{max}^d(N_{maj},4)=K_{max}(N_{maj}-2,4)$. If, in turn, $K_{max}(N_{maj}-2,4)=K_{max}^d(N_{maj}-2,4)$ then $K_{max}(N_{maj}-2,4)=K_{max}(N_{maj}-4,4)$. Proceeding in this fashion, one can find that.

$$K_{max}^d(N_{maj}, 4) = \max_{\substack{0 \leq M < N_{maj} \\ M \text{ even}}} K_{max}^{nd}(M, 4). \tag{IV.1}$$

Further, $$K_{max}(N_{maj},4) = \max(K_{max}^{nd}(N_{maj},4), K_{max}^d(N_{maj},4)). \tag{IV.2}$$

and so $$K_{max}(N_{maj}, 4) = \max_{\substack{0 \leq M < N_{maj} \\ M \text{ even}}} K_{max}^{nd}(M, 4). \tag{IV.3}$$

Thus, it suffices to determine $K_{max}^{nd}(M,4)$ for all $M \leq N_{maj}$ in order to determine $K_{max}(N_{maj},4)$, which will now be considered.

Further, $$K_{max}^{nd}(N_{maj},4) \leq N_{maj}/2 - \lceil \log_2(N_{maj}) \rceil - 1. \quad \text{(IV.4)}$$

To see this, note that in a non-degenerate code, any non-trivial operator with weight $t<d$ will fail to commute with at least one stabilizer. The set of stabilizer generators that the operator does not commute with is called the "error syndrome". This set can be written as a bit string of length $N_{stab}$, or, equivalently, as a vector in $\mathbb{F}_2^{N_{stab}}$. For $d=4$, this means that any operator $\gamma_a \gamma_b$ with $a \neq b$ has weight $t=2<d=4$ and so this operator has a nontrivial error syndrome (here, nontrivial means the syndrome includes at least one generator). Further, the operators $\gamma_a$ and $\gamma_b$ also have nontrivial error syndromes and so because $\gamma_a \gamma_b$ has a nontrivial error syndrome, the error syndromes of $\gamma_a$ and $\gamma_b$ must be distinct because the error syndrome of the product of two operators is simply the sum of the error syndromes, viewed as vectors in $\mathbb{F}_2^{N_{maj}}$. Thus, each single Majorana operator $\gamma_a$ for $a \in \{1, \ldots, N_{maj}\}$ corresponds to a unique error syndrome. There are $N_{stab}$ generators and hence $2^{N_{stab}-1}$ nontrivial error syndromes. However, one generator is fermion parity and all single Majorana operators $\gamma_a$ anti-commute with this operator and hence there are only $2^{N_{stab}-1}$ possible error syndromes for a single Majorana operator (the error syndrome will always be nontrivial since any single Majorana operator anti-commutes with fermion parity). Hence, for a non-degenerate code, $2^{N_{stab}-1} \geq N_{maj}$; using Eq. (III.2), this implies Eq. (IV.4).

Another way to see that each single Majorana operator must correspond to a unique error syndrome is that single Majorana operator errors are correctable and so for a non-degenerate code it must be possible to determine the error from the syndrome.

Given Eq. (IV.4) and Eq. (IV.3), it follows that $$K_{max}(N_{maj},4) \leq N_{maj}/2 - \lceil \log_2(N_{maj}) \rceil - 1. \quad \text{(IV.5)}$$

B. "Hamming Majorana Codes" with $N_{maj}=2^m$

One might think that for any $N_{maj}$ one can construct a code with a K that saturates this inequality (IV.5). After all, it would seem that one could always choose the stabilizers such that the error syndrome gives enough information to uniquely identify any single Majoran fermion error (to ensure that each single Majorana fermion operator has a unique error syndrome.) However, the constraints that the stabilizers must be bosonic and must commute with each other may make this impossible for some $N_{maj}$. In this subsection, it is shown that the inequality is saturated for the particular case that $N_{maj}$ is a power of 2:

$$m \geq 3 \rightarrow K_{max}(2^m,4) = K_{max}^{nd}(2^m,4) = 2^{m-1} - m - 1. \quad \text{(IV.6)}$$

For $m=3$, the construction of this section will give a code with $K=0$ but which has a unique syndrome for each single Majorana error.

The class of codes constructed is closely related to the classical Hamming code, and are termed "Hamming Majorana codes".

One can generate the stabilizer group by m different stabilizers, labelled $S_1, S_2, \ldots, S_m$, and by the fermion parity operator, so that $N_{stab}=m+1$. The stabilizer $S_m$ will be the product of all operators $\gamma_a$ such that the m-th bit of $a-1$ in binary is equal to 1 (the m-th bit is counted from the right, so that the first bit is the least significant, and so on; the order in which the count is performed is completely arbitrary but, for ease of illustration, it is performed from the right). Note that $a-1$ ranges from 0 to $N_{maj}-1$. Thus, in the case $m=4$, consider the following matrix:

$$S = \begin{pmatrix} 0000 \\ 0001 \\ 0010 \\ 0011 \\ 0100 \\ 0101 \\ 0110 \\ 0111 \\ 1000 \\ 1001 \\ 1010 \\ 1011 \\ 1100 \\ 1101 \\ 1110 \\ 1111 \end{pmatrix}.$$

The matrix S is a 16-by-4 matrix. The rows of X label different Majorana operators and the columns of m label different stabilizers, $S_1, \ldots, S_4$. So, for example, the operator $\gamma_{13}$ corresponds to the 12-th row of this table; in binary, 12 is 1100 and so stabilizers $S_3$ and $S_4$ include operator $\gamma_{13}$.

It is clear that such a choice of stabilizers gives each $\gamma_a$ a unique error syndrome. Indeed, the pattern of violated stabilizers is given by the binary representation of a. Further, each $S_i$ has weight $2^{m-1}$ and so has even weight for $m \geq 2$. Also, given any pair $S_i, S_j$ for $i \neq j$, the number of operators $\gamma_a$ which are in both $S_i$ and $S_j$ is equal to $2^{m-2}$ and so is even for $m \geq 3$. So, for $m \geq 3$, this defines a valid code.

Figure 1B:
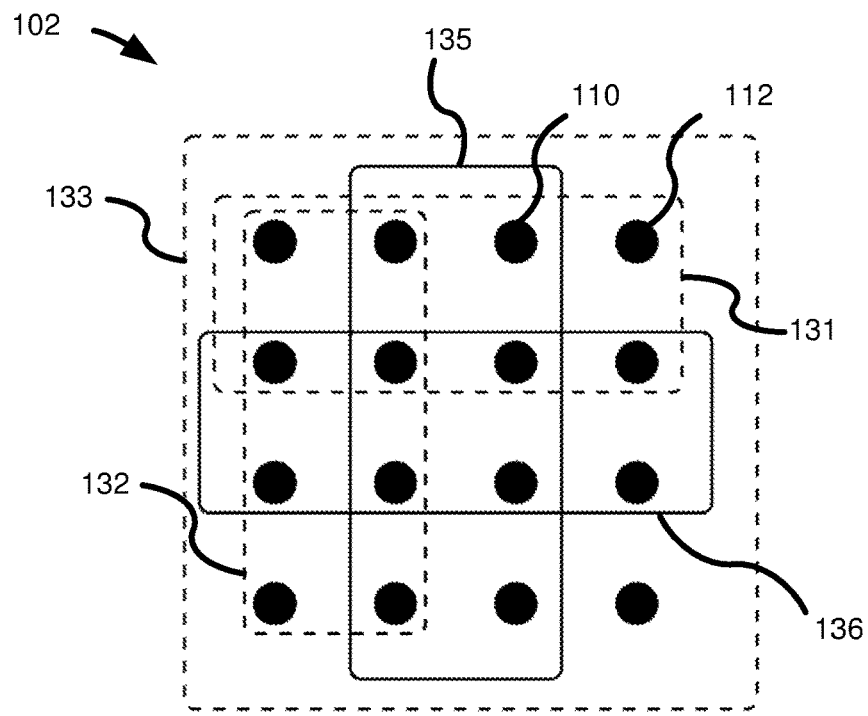
FIG. 1(B) is a block diagram 102 showing stabilizers for the Hamming Majorana code with $N_{maj}$=16.

For $m=4$, this defines a code $N_{maj}=16$, $K=3$, $d=4$. It is interesting to compare this to another code on 16 Majorana fermions. There is a 4 qubit code with distance 2 and 2 logical qubits with stabilizers $X_1 X_2 X_3 X_4$ and $Z_1 Z_2 Z_3 Z_4$. Applying the mapping of subsection III C to this 4 qubit code gives a Majorana fermion code with $N_{maj}=16$, $K=2$, $d=4$. FIGS. 1A and 1B are schematic block diagrams 100, 102 showing the stabilizers for these two codes.

Note also that there is no qubit stabilizer code on 4 physical qubits with distance 2 and 3 logical qubits. Hence, no Majorana fermion code with $N_{maj}=16$ derived by mapping from a qubit stabilizer code has as many logical qubits as the Hamming Majorana code.

More specifically, FIG. 1(A) is a block diagram 100 showing stabilizers for a 16 Majorana code derived from the 4 qubit code. Each circle (such as representative circles 110, 112) represents a Majorana mode. Each rounded rectangle (surrounded by either a solid or a dashed line) represents a stabilizer; the stabilizer is the product of Majorana operators on the modes contained inside that rectangle. There are 6 independent stabilizers (stabilizers 121, 122, 123, 124, 125, 126) and hence K=2. The rounded rectangles with dashed lines (121, 122, 123, 124) indicate generators acting on 4 Majorana operators; these are the stabilizers $\gamma_{i,1} \gamma_{i,2} \gamma_{i,3} \gamma_{i,4}$ of the mapping of subsection III C.

FIG. 1(B) is a block diagram 102 showing stabilizers for the Hamming Majorana code with $N_{maj}=16$. There are now only $N_{stab}=5$ independent stabilizers (stabilizers 131, 132, 133, 135, 136). One of the dashed rounded rectangles (stabilizer 133) in FIG. 1(B) surrounds all qubits; this is the parity operator. The solid rounded rectangles are the same in FIG. 1(B) as in FIG. 1(A). The dashed rounded rectangles in FIG. 1(B) generate a subgroup of the dashed rounded rectangles in FIG. 1(A).

Eq. IV.4 shows that no code with $N_{maj} \leq 10$ and distance d=4 can have K>0. It will be shown in the next paragraph that no code with $N_{maj}=12$ has K>0. For $N_{maj}=14$, numerical searches were performed (described in the next section) for a code with $N_{stab}=6$ and did not succeed. Hence, it is believed that no such code exists (it is believed that $N_{maj}=16$ is the minimum number of modes to have d=4, K>0).

For $N_{maj}=12$, in order to have K>0 one must have $N_{stab}=5$. It will now be shown that this is not possible. One of these generators is the fermion parity operator. Call the other generators $g_1, g_2, g_3, g_4$. Of the other stabilizers, there must be one (which will be called $g_4$) with weight 4 (proof: stabilizers have event weight, so possible nontrivial weights are 2, 4, 6, 8, 10. One can multiply a stabilizer of weight w by the fermion parity operator to give a stabilizer with weight 12−w. So, one can assume the generators have weights 2, 4, 6. For a non-degenerate code, no generators have weight 2, so one can take generators to have weights 4, 6. Given two distinct generators with weights 6 (such that their product is not the fermion parity operator), their product must be 0 mod 4 (since they commute, so there are an even number of modes that they both act on), so one can assume the product has weight 4). Given a stabilizer of weight 4, without loss of generality let it be $\gamma_9\gamma_{10}\gamma_{11}\gamma_{12}$. There are 8 possible single Majorana errors which commute with this stabilizer (errors on Majorana modes $\gamma_1, \ldots, \gamma_8$), so one needs the remaining 3 generators to uniquely identify those errors. The only way to uniquely identify those errors (since there are 8 possible errors and $2^3$ syndromes) is to use something similar to a Hamming Majorana code: the remaining 3 stabilizer generators $g_1, g_2, g_3$ must each be a generator of the Hamming Majorana code with $N_{maj}=8$ on the first 8 modes multiplied by some product of $\gamma_9, \ldots, \gamma_{12}$. Call these products $p_1, p_2, p_3$, respectively; $g_a$ is equal to a Hamming Majorana generator on the first 8 modes multiplied by $p_a$. Since $g_1, g_2, g_3$ commute with each other, the operators $p_1, p_2, p_3$ commute with each other, and further all have even weight. Hence, up to multiplication by $g_4$, and up to permutation of modes 9, 10, 11, 12, the operators $p_a$ are equal to either identity or $\gamma_9\gamma_{10}$. Hence, one cannot have a unique syndrome for each single Majorana error.

V. Numerical Search for Other Codes

This section describe numerical searches performed for other codes with d=4, 6. The discussion begins with the case d=4, and describe the algorithm there. This algorithm is based on a random walk through codes. Some properties of the walk are also described. Finally, modifications to the algorithm are discussed for the case d≥6 and results are given for d=6.

A. Distance d=4 Codes

The Hamming Majorana codes give distance 4 codes with optimal K for $N_{maj}=16, 32$. For other values of $N_{stab}$ with $18 \leq N_{stab} \leq 30$, a numerical search was conducted for other distance d=4 codes, the search was performed for non-degenerate codes.

The search was a random search, implemented as follows. Given values of $N_{maj}$ and $N_{stab}$ were chosen. The algorithm searches through codes until either it finds that a distance 4 code or until it gives up after a sufficiently large number of iterations. One stabilizer generator will be the fermion parity operator, which is not explicitly stored, so in fact the algorithm only stores the remaining $N_{stab}-1$ generators as the way it defines the code. These $N_{stab}-1$ generators are referred to as the "stored list".

The stored list is initialized to $\gamma_1\gamma_2$ and $\gamma_3\gamma_4$ and so on, up to $\gamma_{2(N_{stab}-1)-1}\gamma_{2(N_{stab}-1)}$. In addition, there is the fermion parity operator, as mentioned above. This is a valid code (in that all stabilizers have even weight and commute with each other) but it has only distance 2.

Then, the algorithm iterates the following for some number of steps. First, it randomly updates the stabilizers. This is done by choosing 4 different Majorana modes at random. Let these modes be i,j,k,l. Then, it performs the replacements:

$$\gamma_i \to \gamma_j\gamma_k\gamma_l \quad (V.1)$$

$$\gamma_j \to \gamma_i\gamma_k\gamma_l \quad (V.2)$$

$$\gamma_k \to \gamma_i\gamma_j\gamma_l \quad (V.3)$$

$$\gamma_l \to \gamma_i\gamma_j\gamma_k \quad (V.4)$$

That is, for each stabilizer generator in the stored list, it replaces every occurrence of $\gamma_i$ by $\gamma_j\gamma_k\gamma_l$. These replacements are all performed in parallel; that is, $\gamma_i\gamma_j$ is replaced by $\gamma_j\gamma_k\gamma_l\gamma_i\gamma_k\gamma_l$. Note that the sign of the stabilizer generator is not considered (different choices of signs define a code with the same d, $N_{stab}$), so the sign is not tracked during this replacement. Note also that this replacement does not change the fermion parity operator.

This update procedure allows one to perform a rapid random walk through different codes. The advantage of doing it this way is that each time a new code is generated, it is guaranteed that it will be valid, having even weight stabilizers that commute with each other, as the replacements maintain the algebra of anti-commutation relations obeyed by the Majorana operators.

An alternative way to define the replacement is that if a stabilizer generator contains an odd number of operators $\gamma_i,\gamma_j,\gamma_k,\gamma_l$ then that generator is multiplied by $\gamma_i\gamma_j\gamma_k\gamma_l$, up to signs. This update can be performed very quickly using bitwise operations, storing each stabilizer as a bit string, then ANDing the bit string with a mask which is a 1 in the bits corresponding to i,j,k,l (these masks can be precomputed for all $\binom{N}{4}$ choices of i<j<k<l) and then count the number of 1 bits; if this number is odd, the bit string can be XORed with the mask.

Then, once the new code is generated, one can check if it has distance 4. This can again be done with bitwise operations. For of the $\binom{N}{2}$ different operators $\gamma_i\gamma_j$ with i<j, a mask with a 1 in the bits corresponding to i,j can be generated. One can then check whether, for each mask, there is at least one stabilizer generator which anti-commutes; if so, the code has distance d>2. This can be done by ANDing the mask with the bit string corresponding to the generator and counting if there are an odd number of 1s in the result. If a code with distance d>2 is found, then the procedure is successful; otherwise, it can continue.

For each $N_{maj}$, increasing values of $N_{stab}$ were tried until a code was found. For each value of $N_{stab}$, for example, 2000 independent runs were performed with $10^8$ steps on each run. Only if all those runs failed was the value of $N_{stab}$ increased the procedure tried again. The results are shown in Table I. This table shows the best non-degenerate codes found; note that. K is non-monotonic with $N_{maj}$. Using this table and Eq. (IV.1), the best codes are shown in table II, and were also

TABLE I

Table showing non-degenerate codes found for $N_{maj} = 16, \ldots, 30$. The value for 16 is the Hamming Majorana code, others are from computer search as explained in text. The value $N_{stab}$ is the smallest value of $N_{stab}$ for the given $N_{maj}$ for which a non-degenerate distance 2 code was found. Lines with a checkmark indicate that that code has larger K than any code that was found with smaller $N_{maj}$; these lines are used to make table II.

| $N_{maj}$ | $N_{stab}$ | K | |
|---|---|---|---|
| 16 | 5 | 3 | ✓ |
| 18 | 7 | 2 | |
| 20 | 6 | 4 | ✓ |
| 22 | 7 | 4 | |
| 24 | 6 | 6 | ✓ |
| 26 | 7 | 6 | |
| 28 | 7 | 7 | ✓ |
| 30 | 7 | 8 | ✓ | compared to the best codes derived from qubit stabilizer codes using the mapping of subsection III C. Generators for some of the codes are given in the Appendix.

As a test of the algorithm, it was also run for $N_{maj}=32$, $N_{stab}=6$, where on 882 out of the 2000 runs it succeeded in finding a code with distance 4. Because it is known that such a code exists (the Hamming Majorana code), this gives an indication that the algorithm will find a code when it exists.

B. Properties of Random Walk

There are two notable properties of the random walk described above. First, the transition probabilities obey detailed balance as follows. Let c represent the state of the algorithm, namely the stored list of stabilizers. Let. $P_{c,c'}$ denote the transition probability from state c to some other state c'. Then, these probabilities obey detailed balance in that. $P_{c,c'}=P_{c',c}$. To see this, note that if some given choice of i,j,k,l leads to a transition from c to c', then the same choice of i,j,k,l leads to a transition from c' to c.

Second, consider any stored list c such that the list has $N_{stab}-1$ independent stabilizers, and such that the fermion parity operator is not in the group generated by the stored list of stabilizers. It will be shown that there is a sequence of replacements that turns this stored list into the list of stabilizers $\gamma_1\gamma_2, \gamma_3\gamma_4, \ldots \gamma_{2(N_{stab}-1)-1}\gamma_{2(N_{stab}-1)}$, up to possibly a permutation of the Majorana operators. Combined with detailed balance above, this implies that, up to a permutation of the

TABLE II

Table showing codes found for $N_{maj} = 16, \ldots, 32$, including both degenerate and non-degenerate codes. The table is built using the codes with a checkmark in Table I and using Eq. (IV.1). The final column, called $K_{qubit}$ and given only for codes where $N_{maj}$ is a multiple of 4, is the maximum possible number of logical qubits for a distance 4 Majorana fermion code derived from a distance 2 qubit stabilizer code; the bounds from URL http://www.codetables.de are used to get $K_{qubit}$ for the qubit stabilizer codes.

| $N_{maj}$ | $N_{stab}$ | K | $K_{qubit}$ |
|---|---|---|---|
| 16 | 5 | 3 | 2 |
| 18 | 6 | 3 | |
| 20 | 6 | 4 | 2 |
| 22 | 7 | 4 | |
| 24 | 6 | 6 | 4 |
| 26 | 7 | 6 | |
| 28 | 7 | 7 | 4 |
| 30 | 7 | 8 | |
| 32 | 6 | 10 | 6 |

Majorana operators, the random walk will ultimately explore all possible codes with the given $N_{stab}$ up to permutation of the Majorana operators.

Consider the first stabilizer in the list. It is shown how to turn it into $\gamma_1\gamma_2$. The stabilizer cannot have weight $N_{maj}$ since it is not equal to the fermion parity operator. If it has weight between 4 and $N_{maj}-2$, one can find i<j<k such that the stabilizer includes $\gamma_i,\gamma_j,\gamma_k$ and one can find an l such that the stabilizer does not include $\gamma_l$. Performing the replacement with the given i,j,k,l reduces the weight of the stabilizer by 2. Continue in this fashion until it has weight 2. Once has weight 2, then one can turn it into $\gamma_1\gamma_2$ by permutations.

The procedure can be repeated for the second stabilizer in the list. For this discussion, only the action of the stabilizer on modes $\gamma_3, \ldots, \gamma_{N_{maj}}$, is considered. That is, the bits in the bit string corresponding to modes 1,2 are ignored, and the "weight" is defined to be the number of other bits which are nonzero. The weight of the stabilizer must be less than $N_{maj}-2$ since the fermion parity operator is not in the group generated by the first two stabilizers. i,j,k,l are found as in the above paragraph, choosing 2<i,j,k,l, reducing the weight of the stabilizer until it is equal to 2. Then, once the weight is equal to 2, one can permute until the stabilizer is equal to $\gamma_3\gamma_4$, possibly multiplied by $\gamma_1\gamma_2$.

This procedure is continued for the third, fourth, etc. . . . stabilizers. On the j-th stabilizer, the first 2(j−1) bits in the bit string are ignored, and the weight of the remaining bits reduced. Permutations are then applied until the stabilizer is equal to $\gamma_{2j-1}\gamma_{2j}$, possibly multiplied by earlier stabilizers in the list.

This procedure requires using permutations. If $N_{maj} \geq 5$ (as it is in all cases of interest), the group generated by Eq. (V.1) includes permutations, so in fact the random walk explores all possible permutations. To see that the group includes permutations in this case, consider five modes, $\gamma_1, \ldots, \gamma_5$. Apply Eq. (V.1) three times, using first i=1, j=2, k=3, l=4, then i=2, j=3, k=4, l=5 and finally i=1, j=2, k=3, l=4. Then, up to signs, the effect is to map $\gamma_1 \leftrightarrow \gamma_5$, while preserving $\gamma_2,\gamma_3,\gamma_4$. Since any exchange of a pair of Majoranas is in the group, the group contains all permutations.

C. Distance d=6 Codes

A numerical search was also performed for codes with distance d=6. In this case, a search was performed for all possible codes, degenerate or not. A similar algorithm to the search for d=4 codes was used. The stored list of generators was initialized in the same way as in the search for d=4. The same Eq. (V.1) was used to update stabilizer generators to perform a random walk through codes. However, a set of generators for 2K independent, logical operators was also stored. These are initialized to logical operators of the initial code, and then are also updated using Eq. (V.1). This list is used in checking distance of the code.

The only change is how the distance of the codes was tested. Since a code with distance 6 is sought, one can check operators with weight 4 as well as those with weight 2, and since degenerate codes might also be included, one can check if there is an operator of weight 2 or 4 which commutes with all generators and which does not commute with at least one logical operator. Checking that an operator of weight 2 or 4 commutes with a generator is done in the same way as in the search for d=4 codes (a mask is stored for each such operator, and the mask is ANDed with each generator and the bits in the result are counted). To check commutation with logical operators, the list of logical operators of the code that was stored is used, and bitwise operations are again used.

The algorithm can be used in the same way, choosing a given $N_{maj}$ and increasing $N_{stab}$ until a d=6 code was found. As before, the algorithm was run 2000 times, taking $10^8$ steps for each run, until giving up and increasing $N_{stab}$. The results are shown in Table III, as well as a comparison to the best distance 6 Majorana fermion codes derived from a qubit stabilizer code. Generators for these codes are shown in the Appendix.

The code with $N_{maj}$=20 has the same number of qubits as a code derived from a qubit

TABLE III

Table showing optimal codes found for $N_{maj} \leq 32$. If an entry is not present in the table for a given $N_{maj}$, it means that the best code found for that $N_{maj}$ had the same K as a code in the table with a smaller $N_{maj}$. For example, the optimal code found with $N_{maj}$ = 32 has $N_{stab}$ = 13 and hence K = 3, the same as the code shown in the table with $N_{maj}$ = 30. No distance d = 6 codes were found with $N_{maj}$ <20. The column $K_{qubit}$, given only for codes where $N_{maj}$ is a multiple of 4, gives the maximum possible number of logical qubits for a distance 6 Majorana fermion code derived from a distance 3 qubit stabilizer code; the bounds from URL http://www.codetables.de are used to get $K_{qubit}$ for the qubit stabilizer codes.

| $N_{maj}$ | $N_{stab}$ | K | $K_{qubit}$ |
|---|---|---|---|
| 20 | 9 | 1 | 1 |
| 28 | 12 | 2 | 1 |
| 30 | 12 | 3 | | stabilizer code. Indeed, the Majorana fermion code that was found (at least for all runs inspected) was a code derived from a qubit stabilizer code. For $N_{maj}$=28, the code has more logical qubits than a code derived from a qubit stabilizer code. In this case (at least for all runs that were inspected), it was found that the code had one weight 4 stabilizer in the stabilizer group; thus, one may also build such a code out of 1 qubit and 24 Majorana fermions. With $N_{maj}$=30, for all runs that were inspected, there were no weight 4 stabilizers in the stabilizer group.

VI. Further Observations

Several small Majorana fermion codes have been described. Interestingly, there exist codes whose performance is better than that of any code derived from a qubit code. The simplest one, the Hamming Majorana code with $N_{maj}$=16 in fact has a stabilizer group which is a subgroup of the stabilizer group of the Majorana code derived from a 4 qubit code.

A numerical search algorithm was also disclosed herein. Using bitwise operations, this search can be run extremely quickly. A similar numerical search could be performed for qubit codes. The basic idea of the random search is that it allows one to turn a valid set of stabilizers (obeying commutation relations) to another valid set; one could construct a similar search algorithm for qubit stabilizer codes by randomly applying operations from the Clifford group.

Efficient implementation of such code can be done if it is possible to measure the stabilizers directly, e.g., as in the scheme of T. Hyart, B. van Heck, I. Fulga, M. Burrello, A. Akhmerov, and C. Beenakker, Physical Review B 88, 035121 (2013). One property of these codes is that each stabilizer (except for the fermion parity operator) can be written in two different, non-overlapping ways. For example, with $N_{maj}$=16, the operators $\gamma_1 \ldots \gamma_8$ and $\gamma_9 \ldots \gamma_{16}$ agree, up to fermion parity. Hence, this provides two distinct ways to measure the same stabilizer; these independent measurements may allow one to reduce the effect of measurement errors. The $N_{maj}$=16 Hamming Majorana code has a physical layout, shown in FIGS. 1(A) and 1(B), which may simplify some of these measurements, as the generators are all contained in local regions (squares or rectangles).

VII. Appendix

A. Table of Codes Found for d=4

Table IV is a table of some of the codes found using numerical search for distance d=4. Stabilizers are shown for non-degenerate codes with $N_{maj}$=20, 24, 28, 30. These are the codes shown with a checkmark in table I.

TABLE IV

Distance d = 4 codes. $N_{stab}$ − 1 stabilizer generators are given for each code as bit strings of length $N_{maj}$; a 1 in the string in some position indicates that the generator contains the given Majorana operator. In addition, the fermion parity operator (not shown in the table) is a generator.

$N_{maj}$ = 20

01001101010001011101
10011010110101111100
11010110101011000100
01101010101100101001
10100111001010111101

$N_{maj}$ = 24

110110110100100010101001
000010110111010010010111
111000100000001011110111
101000011001000000001011
001111100001011000101101

$N_{maj}$ = 28

0010000001110101010011011010
0110110010100110101001010110
0111110111011011110101010010
0001110000101110010001101111
1001011110000111001111000001
0000111000011001110100111110

$N_{maj}$ = 30

010010100111011011011000000110
001010110011100100001010111010
100001011011011100011100010001
011011001001000001100000011001
101000010110001101111001100001
011010101001001101001111111101

B. Table of Codes Found for d=6

In Table V, a table is given of the codes found using numerical search for distance d=6.

TABLE V

Distance d = 6 codes. $N_{stab}$ − 1 stabilizer generators are given for each code as bit strings of length $N_{maj}$; a 1 in the string in some position indicates that the generator contains the given Majorana operator. In addition, the fermion parity operator (not shown in the table) is a generator.

$N_{maj} = 28$ 1100110110001100000001000010
0001100110010000010100111110
0011001010100001100111101101
1011100100010101011010111000
0000010101110010101010000001
0010011100000011101100101001
0000101001101111110110111111
0010010100101000100101110000
1101100001101001101010101001
1010010101101110011001110000
0101011000001111010111111111

$N_{maj} = 30$ 011100000111001010010110011100
000111111101001001001010011110
111001000011101100110011100110
100111111010111000111011011101
010110101011000011011011110010
001100001100111011001110111100
100001110110010011100111101010
011000000001111110000100011001
101001001111000111110011101011
000100001001011011111100011001
100110000010011101111110100000

VIII. General Embodiments

This section describes several example embodiments for implementing embodiments of the disclosed technology. The disclosed tools and techniques are not to be construed as limiting in any way, as an one or more of the illustrated method acts can be performed alone or in various other combinations and subcombinations with one another. Further, any one or more of the disclosed method acts can be performed with one or more other method acts disclosed herein.

Figure 6:
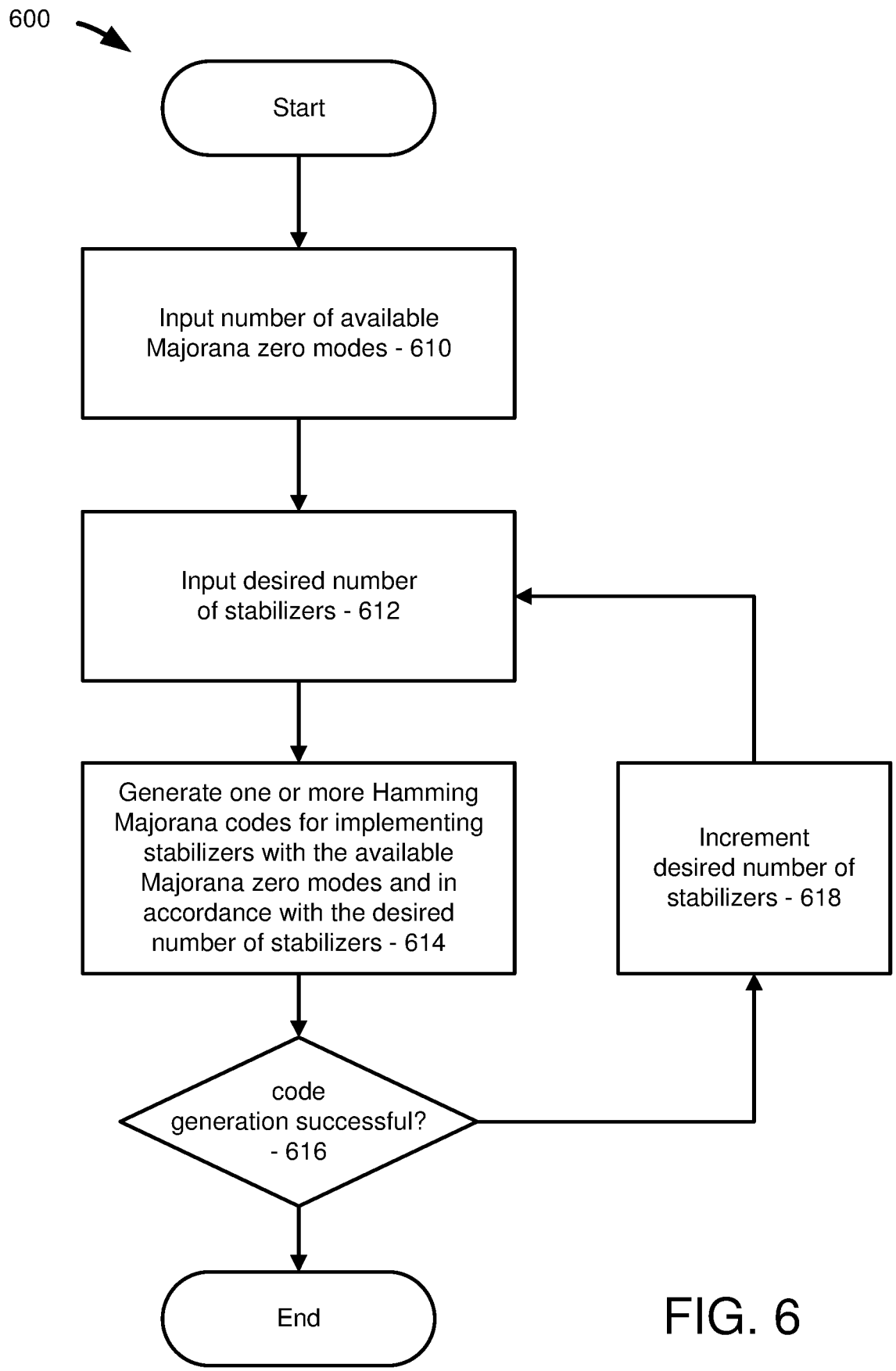
FIG. 6 is a flowchart for an example method for generating Hamming Majorana codes for quantum computing devices in accordance an embodiment of the disclosed technology.

FIG. 6 is a flowchart of an example method 600 for generating Hamming Majorana codes for quantum computing devices in accordance an embodiment of the disclosed technology. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

In some embodiments, the methods below are performed by a classical computer configured to communicate with and control a quantum computer. Still further, the method acts can be embodied as computer-executable instructions which when executed by a computer cause the computer to perform the methods.

At 610, a number of available Majorana zero modes is input (e.g., buffered into memory or otherwise prepared for further processing).

At 612, a desired number of stabilizers is input (e.g., buffered into memory or otherwise prepared for further processing).

At 614, one or more Hamming Majorana codes are generated for implementing stabilizers with the available Majorana zero modes and in accordance with the desired number of stabilizers. In example implementations, the generation of the Hamming Majorana codes is performed at least in part using a random search procedure. In certain implementations, the generation of the Hamming Majorana codes is performed at least in part with a constrained distance. In some examples, the constrained distance is 4; in the examples, the constrained distance is 6.

At 616, a determination is made as to whether the code generation at 614 was successful. If it was not, then the desired numbered of stabilizers is incremented at 618 and the generation procedure is repeated.

The disclosed technology also includes topological quantum computing devices configured to implement embodiments of the error-correcting technologies described herein. For example, in some embodiments, a topological quantum computer is configured to implement a quantum computation using Majorana zero modes. In certain implementations, a set of $N_{maj}$ Majorana zero modes are configured to obtain a code space with K logical bits, where K is less than $N_{maj}$, and wherein the code space is formed from a series of stabilizers formed among the Majorana zero modes and configured to provide error correction to the Majorana zero modes during the quantum computation.

In some cases, the code space has a distance of 4. For instance, the stabilizers for the code space can correspond to any of the codes shown in Table IV. In other cases, the code space has a distance of 6. For instance, the stabilizers for the code space can correspond to any of the codes shown in Table V.

In further examples, 16 Majorana zero modes are present in the topological quantum computer, and 5 independent stabilizers are present. In particular implementations of such examples, one of the 5 stabilizers encompasses all 16 Majorana zero modes, and 4 of the 5 stabilizers encompass 6 respective Majorana zero modes.

In some examples, $K=N_{maj}/2-N_{stab}$, where $N_{stab}$ is the number of stabilizers.

Another example embodiment is a quantum computing device configured to implement logical qubits via Majorana zero modes in a topological quantum infrastructure, the Majorana zero modes being arranged to realize a set of physical qubits whose states are correctable to produce the logic qubits via a series of stabilizers formed among the physical qubits.

In some cases, the logical qubits and the physical qubits are in a code space of a distance of 4. For instance, the stabilizers for the code space can correspond to any of the codes shown in Table IV.

In other cases, the logical qubits and the physical qubits are in a code space of a distance of 6. For instance, the stabilizers for the code space can correspond to any of the codes shown in Table V.

In further examples, 16 Majorana zero modes are present, and there are 5 independent stabilizers. In particular implementations, one of the 5 stabilizers encompasses all 16 Majorana zero modes, and 4 of the 5 stabilizers encompass 6 respective Majorana zero modes.

In some examples, $K=N_{maj}/2-N_{stab}$, where $N_{stab}$ is the number of stabilizers.

IX. Example Computing Environments

Figure 2:
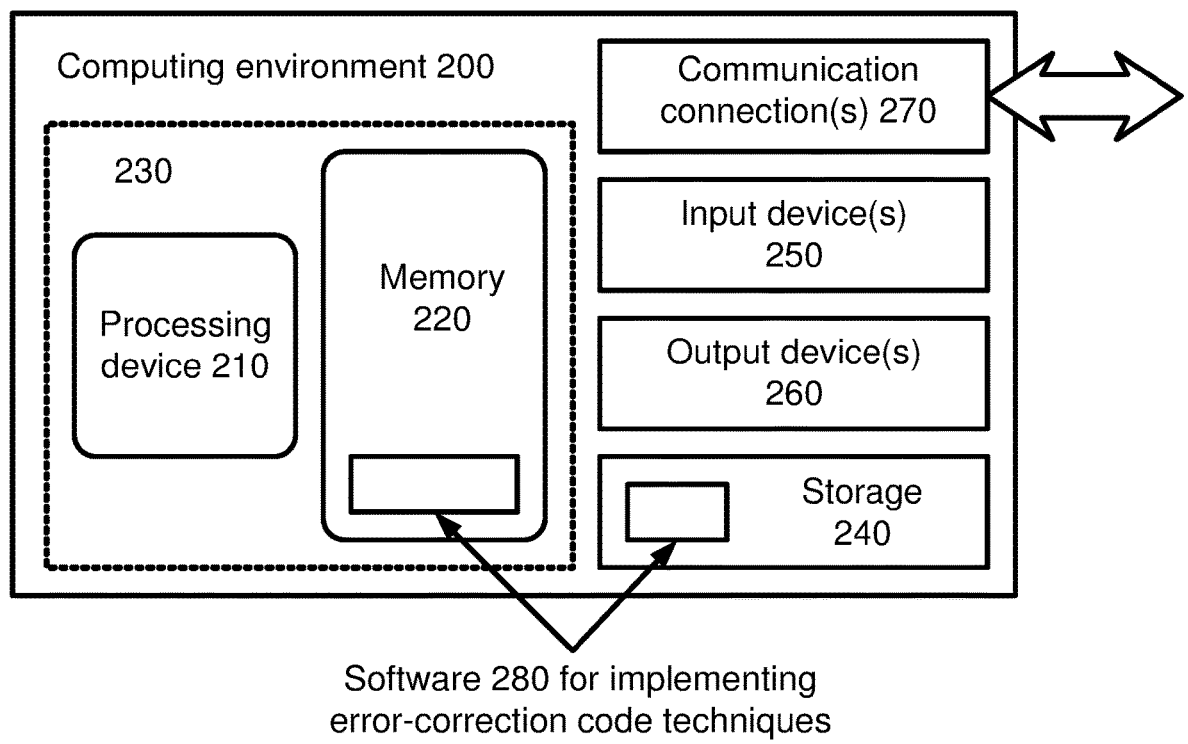
FIG. 2 illustrates a generalized example of a suitable computing environment in which several of the described embodiments can be implemented.

FIG. 2 illustrates a generalized example of a suitable computing environment 200 in which several of the described embodiments can be implemented. The computing environment 200 is rot intended to suggest any limitation as to the scope of use or functionality of the disclosed technology, as the techniques and tools described herein can be implemented in diverse general-purpose or special-purpose environments that have computing hardware.

With reference to FIG. 2, the computing environment 200 includes at least one processing device 210 and memory 220. In FIG. 2, this most basic configuration 230 is included within a dashed line. The processing device 210 (e.g., a CPU or microprocessor) executes computer-executable instructions. In a multi-processing system, multiple processing devices execute computer-executable instructions to increase processing power. The memory 220 may be volatile memory (e.g., registers, cache, RAM, DRAM, SRAM), non-volatile memory (e.g., ROM, EEPROM, flash memory), or some combination of the two. The memory 220 stores software 280 implementing tools for implementing embodiments of the disclosed technology (e.g., any of the disclosed techniques for implementing error correcting qubits or generating codes for such circuits).

The computing environment can have additional features. For example, the computing environment 200 includes storage 240, one or more input devices 250, one or more output devices 260, and one or more communication connections 270. An interconnection mechanism (not shown), such as a bus, controller, or network, interconnects the components of the computing environment 200. Typically, operating system software (not shown) provides an operating environment for other software executing in the computing environment 200, and coordinates activities of the components of the computing environment 2800.

The storage 240 can be removable or non-removable, and includes one or more magnetic disks (e.g., hard drives), solid state drives (e.g., flash drives), magnetic tapes or cassettes, CD-ROMs, DVDs, or any other tangible non-volatile storage medium which can be used to store information and which can be accessed within the computing environment 200. The storage 240 can also store instructions for the software 280 generating or implementing the codes as disclosed herein (e.g., any of the Majorana fermion codes described herein).

The input device(s) 250 can be a touch input device such as a keyboard, touchscreen, mouse, pen, trackball, a voice input device, a scanning device, or another device that provides input to the computing environment 200. The output device(s) 260 can be a display device (e.g., a computer monitor, laptop display, smartphone display, tablet display, netbook display, or touchscreen), printer, speaker, or another device that provides output from the computing environment 200.

The communication connection(s) 270 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods or compilation/synthesis techniques for generating the disclosed circuits can be described in the general context of computer-readable instructions stored on one or more computer-readable media. Computer-readable media are any available media (e.g., memory or storage device) that can be accessed within or by a computing environment. Computer-readable media include tangible computer-readable memory or storage devices, such as memory 220 and/or storage 240, and do not include propagating carrier waves or signals per se (tangible computer-readable memory or storage devices do not include propagating carrier waves or signals per se).

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Figure 3:
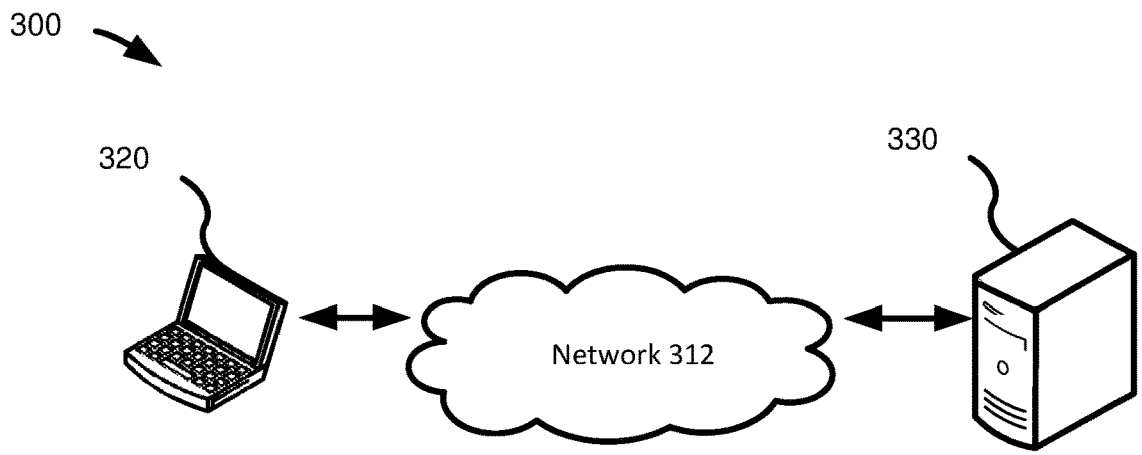
FIG. 3 illustrates an example of a possible network topology (e.g., a client-server network) for implementing a system according to the disclosed technology.

An example of a possible network topology 300 (e.g., a client-server network) for implementing a system according to the disclosed technology is depicted in FIG. 3. Networked computing device 320 can be, for example, a computer running a browser or other software connected to a network 312. The computing device 320 can have a computer architecture as shown in FIG. 2 and discussed above. The computing device 320 is not limited to a traditional personal computer but can comprise other computing hardware configured to connect to and communicate with a network 312 (e.g., smart phones, laptop computers, tablet computers, or other mobile computing devices, servers, network devices, dedicated devices, and the like). In the illustrated embodiment, the computing device 320 is configured to communicate with a computing device 330 (e.g., a remote server, such as a server in a cloud computing environment) via a network 312. In the illustrated embodiment, the computing device 320 is configured to transmit input data to the computing device 330, and the computing device 330 is configured to implement any of the error correcting techniques or code generation techniques disclosed herein and outputting results to the computing device 320. Any of the data received from the computing device 330 can be stored or displayed on the computing device 320 (e.g., displayed as data on a graphical user interface or web page at the computing devices 320). In the illustrated embodiment, the illustrated network 312 can be implemented as a Local Area Network (LAN) using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 312 can be the Internet or a similar public network and operate using an appropriate protocol (e.g., the HTTP protocol).

Figure 4:
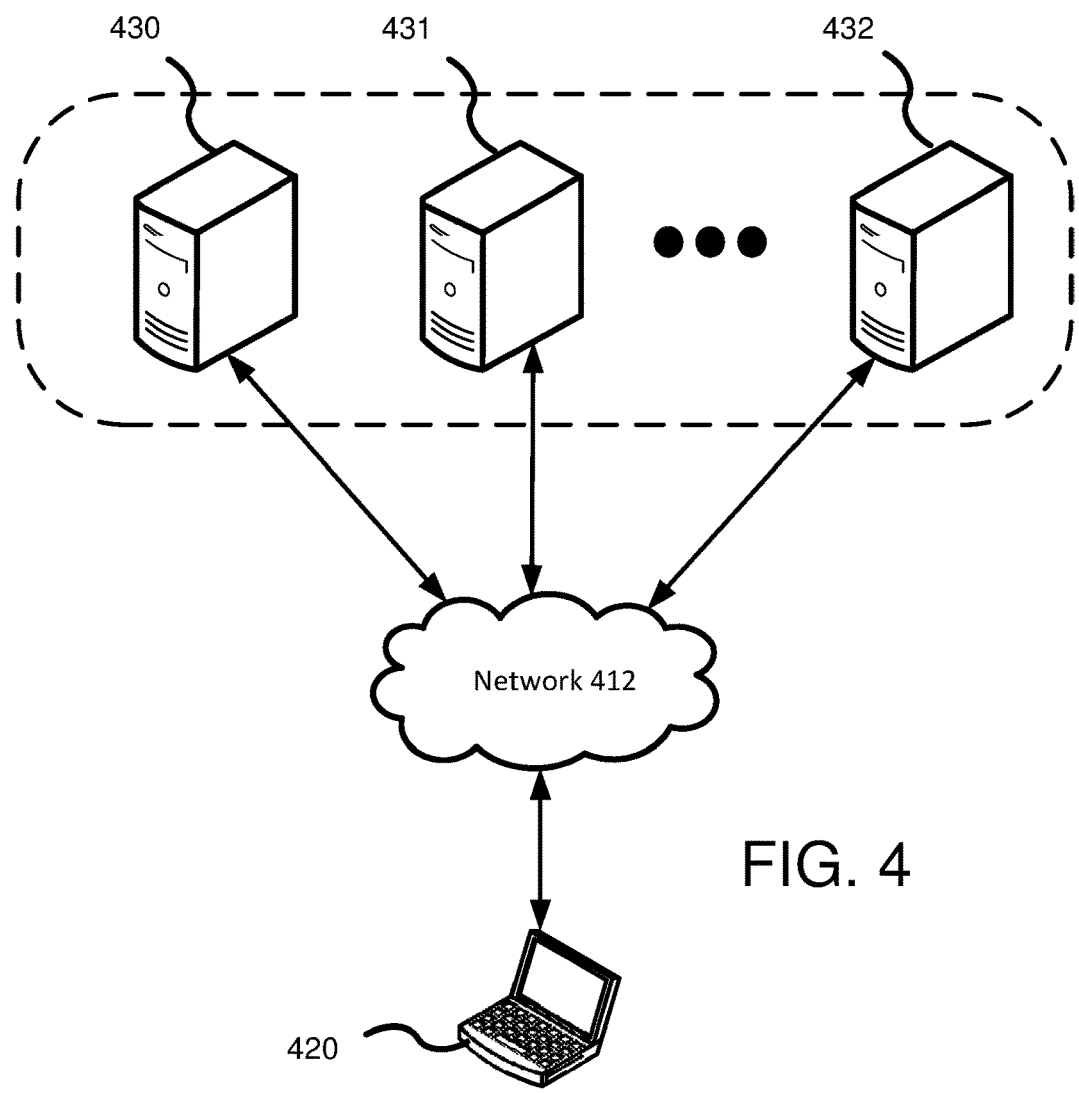
FIG. 4 illustrates an example of a possible network topology (e.g., a distributed computing environment) for implementing a system according to the disclosed technology.

Another example of a possible network topology 400 (e.g., a distributed computing environment) for implementing a system according to the disclosed technology is depicted in FIG. 4. Networked computing device 420 can be, for example, a computer running a browser or other software connected to a network 4112. The computing device 420 can have a computer architecture as shown in FIG. 2 and discussed above. In the illustrated embodiment, the computing device 420 is configured to communicate with multiple computing devices 430, 431, 432 (e.g., remote servers or other distributed computing devices, such as one or more servers in a cloud computing environment) via the network 412. In the illustrated embodiment, each of the computing devices 430, 431, 432 in the computing environment 400 is used to perform at least a portion of any of the error correcting techniques or code generation techniques disclosed herein. In other words, the computing devices 430, 431, 432 form a distributed computing environment in which the disclosed techniques are shared across multiple computing devices. The computing device 420 is configured to transmit input data to the computing devices 430, 431, 432, which are configured to distributively implement any of the error correcting techniques or code generation techniques disclosed herein and to provide results to the computing device 420. Any of the data received from the computing devices 430, 431, 432 can be stored or displayed on the computing device 420 (e.g., displayed as data on a graphical user interface or web page at the computing devices 420). The illustrated network 412 can be any of the networks discussed above with respect to FIG. 3.

Figure 5:
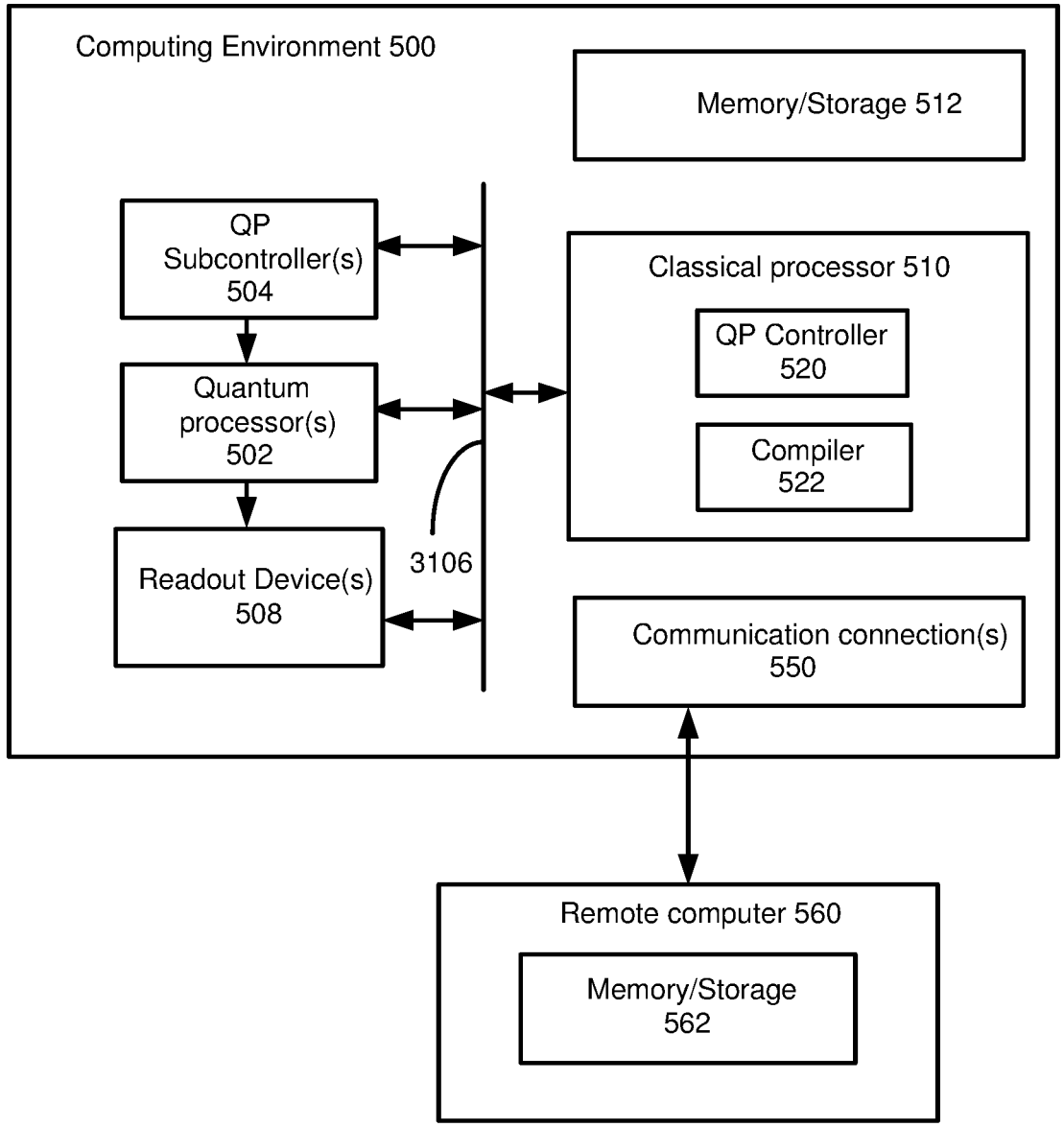
FIG. 5 illustrates an exemplary system for implementing the disclosed technology.

With reference to FIG. 5, an exemplary system for implementing the disclosed technology includes computing environment 500. In computing environment 500, a compiled quantum computer circuit description, which can include quantum computer circuit description data for implementing any of the error correcting techniques (e.g., Majorana fermion code techniques) as disclosed herein, can be used to program (or configure) one or more quantum processing units such that the quantum processing unit(s) implement the circuit described by the quantum computer circuit description. As noted, the quantum computer circuit description can implement any of the error correcting techniques (e.g., Majorana fermion code techniques) as discussed herein.

The environment 500 includes one or more quantum processing units 502 and one or more readout device(s) 508. The quantum processing unit(s) execute quantum circuits that are precompiled and described by the quantum computer circuit description. The quantum processing unit(s) can be a topological quantum architecture (e.g., a topological quantum computing device using Majorana zero modes). The precompiled quantum circuits (including, for example, any of the disclosed stabilizers) can be sent into (or otherwise applied to) the quantum processing unit(s) via control lines 506 at the control of quantum processor controller 520. The quantum processor controller (QP controller) 520 can operate in conjunction with a classical processor 510 (e.g., having an architecture as described above with respect to FIG. 2) to implement the desired quantum computing process. In the illustrated example, the QP controller 520 further implements the desired quantum computing process via one or more QP subcontrollers 504 that are specially adapted to control a corresponding one of the quantum processor(s) 502. For instance, in one example, the quantum controller 520 facilitates implementation of the compiled quantum circuit by sending instructions to one or more memories (e.g., lower-temperature memories), which then pass the instructions to low-temperature control unit(s) (e.g., QP subcontroller(s) 504) that transmit, for instance, pulse sequences representing the gates to the quantum processing unit(s) 502 for implementation. In other examples, the QP controller(s) 520 and QP subcontroller(s) 504 operate to provide appropriate magnetic fields, encoded operations, or other such control signals to the quantum processor(s) to implement the operations of the compiled quantum computer circuit description. The quantum controller(s) can further interact with readout devices 508 to help control and implement the desired quantum computing process (e.g., by reading or measuring out data results from the quantum processing units once available, etc.)

With reference to FIG. 5, compilation is the process of translating a high-level description of a quantum algorithm into a quantum computer circuit description comprising a sequence of quantum operations or gates, which can include the error correcting mechanisms (e.g., stabilizers) as disclosed herein. The compilation can be performed by a compiler 522 using a classical processor 510 of the environment 500 which loads the high-level description from memory or storage devices 512 and stores the resulting quantum computer circuit description in the memory or storage devices 512.

In other embodiments, compilation and/or Majorana fermion code generation/implementation can be performed remotely by a remote computer 500 (e.g., a computer having a computing environment as described above with respect to FIG. 2) which stores the resulting quantum computer circuit description in one or more memory or storage devices 562 and transmits the quantum computer circuit description and/or training instructions to the computing environment 500 for implementation in the quantum processing unit(s) 502. Still further, the remote computer 500 can store the high-level description and/or Majorana fermion code code generating (or implementing) instructions in the memory or storage devices 562 and transmit the high-level description and/or instructions to the computing environment 500 for compilation and use with the quantum processor(s). In any of these scenarios, results from the computation performed by the quantum processor(s) can be communicated to the remote computer after and/or during the computation process. Still further, the remote computer can communicate with the QP controller(s) 520 such that the quantum computing process (including any compilation, error correction, and/or QP processor control procedures) can be remotely controlled by the remote computer 560. In general, the remote computer 560 communicates with the QP controller(s) 520 and/or compiler/synthesizer 522 via communication connections 550.

In particular embodiments, the environment 500 can be a cloud computing environment, which provides the quantum processing resources of the environment 500 to one or more remote computers (such as remote computer 560) over a suitable network (which can include the internet).

X. Concluding Remarks

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

The invention claimed is:
1. A system, comprising:
a topological quantum computing device; and
a classical computer configured to communicate with and control the topological quantum computing device, the classical computer comprising memory and a processor, the classical computer being programmed to:
configure the topological quantum computing device to implement a quantum computation using Majorana zero modes,
wherein the configuring includes configuring a set of $N_{maj}$ Majorana zero modes to obtain a code space with K logical bits, where K is less than $N_{maj}$, and wherein the code space is formed from a series of stabilizers formed among the Majorana zero modes, configured to provide error correction to the Majorana zero modes during the quantum computation, and not generated from a qubit stabilizer code.

2. The system of claim 1, wherein the code space has a distance of 4.

3. The system of claim 2, wherein the stabilizers for the code space correspond to any of the codes shown below:

$N_{maj} = 20$
01001101010001011101
10011010110101111100
11010110101011000100
01101010101100101001
10100111001010111101
$N_{maj} = 24$
110110110100100010101001
000010110111010010010111
111000100000001011110111
101000011001000000001011
001111100001011000101101
$N_{maj} = 28$
0010000001110101010011011010
0110110010100110101001010110
0111110111011111101010101010
0001110000101110010001101111
1001011110000111001111000001
0000111000011001110100111110
$N_{maj} = 30$
010010100111011011011000000110
001010110011001000010101111010
100001011011011100011100010001
011011001001100000110000011001
101000010110001101111001100001
011010101001001101001111111101.

4. The system of claim 1, wherein the code space has a distance of 6.

5. The system of claim 4, wherein the stabilizers for the code space correspond to any of the codes shown below:

$N_{maj} = 28$
1100110110001100000001000010
0001100110010000010100111110
0011001010100001100111101101
1011100100010101011010111000
0000010101110010101010000001
0010011100000011101100101001
0000101001101111110110111111
0010010100101000100101110000
1101100001101001101010101001
1010010101011100110011110000
0101011000001111010111111111
$N_{maj} = 30$
011100000111001010010100110011100
000111111101001001001010011110
111001000011011001100111100110
100111110101110001110110111101
010110101011000010110111110010
001100001100111011001110111100
100001110110010011100111101010
011000000001111110000100011001
1010010011110001111100111010111
0001000010010110111111100011001
1001100000100111011111110100000.

6. The system of claim 1, wherein, for 16 Majorana zero modes, there are 5 independent stabilizers.

7. The system of claim 6, wherein one of the 5 stabilizers encompasses all 16 Majorana zero modes, and wherein 4 of the 5 stabilizers encompass 6 respective Majorana zero modes.

8. The system of claim 1, wherein $K=N_{maj}/2-N_{stab}$, where $N_{stab}$ is the number of stabilizers.

9. A computer-implemented method of generating Hamming Majorana codes for implementation in a quantum computing device, comprising:
by a computing device, inputting a number of available Majorana zero modes;
by the computing device, inputting a desired number of stabilizers; and
by the computing device, generating one or more Hamming Majorana codes for implementing stabilizers with the available Majorana zero modes and in accordance with the desired number of stabilizers, wherein the generating is performed at least in part using a random search procedure.

10. The method of claim 9, wherein the generating is performed with a constrained distance.

11. The method of claim 10, wherein the constrained distance is 4.

12. The method of claim 10, wherein the constrained distance is 6.

13. The method of claim 9, further comprising, if the generating fails, incrementing the desired number of stabilizers.

14. A quantum computing device configured to implement logical qubits via Majorana zero modes in a topological quantum infrastructure, the Majorana zero modes being arranged to realize a set of physical qubits whose states are correctable to produce the logic qubits via a series of stabilizers formed among the physical qubits and formed independently of a corresponding qubit stabilizer code.

15. The quantum computing device of claim 14, wherein the logical qubits and the physical qubits are in a code space of a distance of 4.

16. The quantum computing device of claim 14, wherein the logical qubits and the physical qubits are in a code space of a distance of 6.

17. The quantum computing device of claim 14, wherein, for 16 Majorana zero modes, there are 5 independent stabilizers.

18. The quantum computing device of claim 17, wherein one of the 5 stabilizers encompasses all 16 Majorana zero modes, and wherein 4 of the 5 stabilizers encompass 6 respective Majorana zero modes.

19. The quantum computing device of claim 14, wherein $K=N_{maj}/2-N_{stab}$, where $N_{stab}$ is the number of stabilizers.

* * * * *